United States Patent
Huang et al.

(10) Patent No.: US 8,124,319 B2
(45) Date of Patent: Feb. 28, 2012

(54) SEMICONDUCTOR LITHOGRAPHY PROCESS

(75) Inventors: Pei-Lin Huang, Taipei (TW); Chun-Yen Huang, Taoyuan (TW); Yi-Ming Wang, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 151 days.

(21) Appl. No.: 12/758,043

(22) Filed: Apr. 12, 2010

(65) Prior Publication Data

US 2011/0250540 A1     Oct. 13, 2011

(51) Int. Cl.
*G03C 5/00*     (2006.01)

(52) U.S. Cl. ........ 430/296; 430/312; 430/327; 430/328; 430/394; 430/396; 430/942

(58) Field of Classification Search .................. 430/296, 430/312, 327, 328, 394, 396, 942
See application file for complete search history.

(56) References Cited

U.S. PATENT DOCUMENTS 6,255,035 B1 *   7/2001   Minter et al. ................. 430/312

* cited by examiner

*Primary Examiner* — Christopher Young
(74) *Attorney, Agent, or Firm* — Winston Hsu; Scott Margo

(57) ABSTRACT

A semiconductor lithography process. A photoresist film is coated on a substrate. The photoresist film is subjected to a flood exposure to blanket expose the photoresist film across the substrate to a first radiation with a relatively lower dosage. The photoresist film is then subjected to a main exposure using a photomask to expose the photoresist film in a step and scan manner to a second radiation with a relatively higher dosage. After baking, the photoresist film is developed.

16 Claims, 2 Drawing Sheets

SEMICONDUCTOR LITHOGRAPHY PROCESS

BACKGROUND OF THE INVENTION

1. Field of the Invention

The present invention relates generally to a lithographic process used in the semiconductor manufacturing process. More particularly, the present invention relates to a double-exposure method that is capable of elongating the lifetime of the radiation source in a lithographic system without affecting the critical dimension (CD) of the circuit features.

2. Description of the Prior Art

Photolithographic technology plays an important role in the manufacture of integrated circuit (IC) chips. Continued improvements in optical projection lithography have enabled the printing of ever-finer features of integrated circuits. This, in turn, has allowed the integrated circuit industry to produce ever more powerful and cost-effective semiconductor devices.

In the field of optical lithographic processing, a photosensitive material is applied to a silicon substrate wafer and then allowed to dry. An exposure tool is utilized to expose the wafer with proper geometrical patterns through a mask by means of a source of light or radiation. After exposure, the wafer is treated to develop the mask images transferred to the photosensitive material. These masking patterns are then used to create the device features of the circuit.

The wavelength used in exposure has been reduced to make finer patterns. However, the rate of shrinkage in device pattern is so fast that it has become difficult to achieve enough resolution only by reduction of exposure wavelength. Several resolution enhancement technologies such as optical proximity correction and phase shifting techniques have been developed to cope with these problems. Extreme ultraviolet (EUV) lithography is a next-generation lithography technology using the 13.5 nm EUV wavelength. However, the wafer throughput of an EUV exposure tool is a critical metric for manufacturing capacity. Given that EUV is a technology requiring high source power, the throughput is limited.

In order to reduce cost, it is highly desirable to prolong the term of usage of the currently used DUV (e.g. KrF or ArF) lithography apparatus before that the EUV lithography appears to be ready in timely fashion. In particular, it is highly desirable in the art to elongate the lifetime of the light source of the costly excimer laser exposure tool.

SUMMARY OF THE INVENTION

It is one object of the invention to provide an improved exposure method in order to solve the above-mentioned shortcomings of the prior art.

According to the claimed invention, a semiconductor lithography process includes providing a substrate; coating the substrate with a photoresist film; subjecting the photoresist film to a flood exposure to blanket expose the photoresist film across the substrate to a first radiation with a relatively lower dosage; subjecting the photoresist film to a main exposure using a photomask to expose the photoresist film in a step and scan manner to a second radiation with a relatively higher dosage; and developing the photoresist film.

According to another embodiment of this invention, a semiconductor lithography process includes providing a substrate; coating the substrate with a photoresist film; subjecting the photoresist film to a petit exposure to expose the photoresist film in a step and scan manner to a first radiation with a relatively lower dosage; subjecting the photoresist film to a main exposure using a photomask to expose the photoresist film in the step and scan manner to a second radiation with a relatively higher dosage; and developing the photoresist film.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized without departing from the scope and spirit of the present invention. The terms wafer and substrate used herein include any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined only by the appended claims, along with the full scope of equivalents to which such claims are entitled.

The present invention pertains to a double-exposure or multi-exposure method that is capable of elongating the lifetime of the radiation source in a lithographic system without affecting the critical dimension (CD) of the circuit features. Although some of the embodiments herein may take KrF (248 nm) exposure tool as an example, the aforesaid lithographic system may include but not limited to the mainstream deep UV (DUV) exposure tools such as KrF scanner exposure tools, ArF scanner exposure tools or $F_2$ scanner exposure tools, extreme UV (EUV) exposure tools or e-beam exposure tools.

Figure 1:
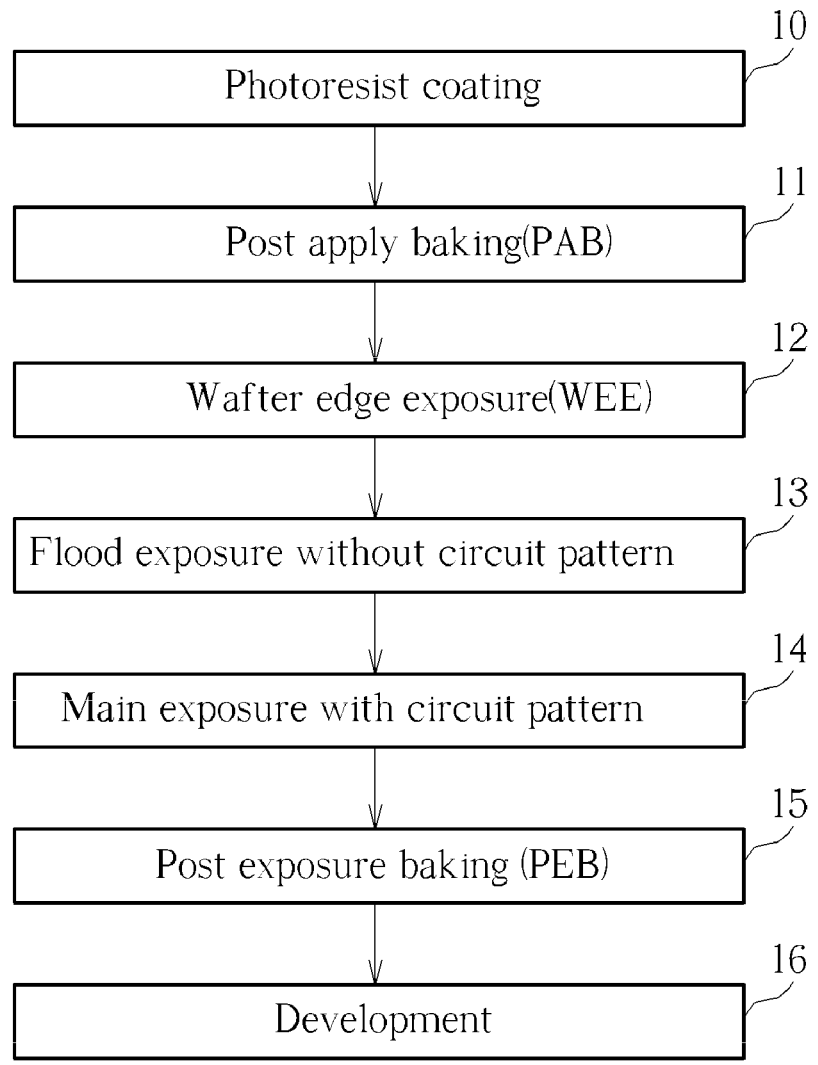
FIG. 1 is a schematic flowchart demonstrating a double-exposure method used in the semiconductor manufacturing process in accordance with one preferred embodiment of this invention.

FIG. 1 is a schematic flowchart demonstrating a double-exposure method used in the semiconductor manufacturing process in accordance with one preferred embodiment of this invention. As shown in FIG. 1, first, in Step 10, a photosensitive material such as a photoresist film is coated onto a main surface of a semiconductor substrate (not shown). The photoresist film may be a positive type photoresist or a negative type photoresist and may be coated on the substrate by conventional spin-on coating techniques. According to the preferred embodiment, the photoresist film has a specific threshold energy for image formation. Optionally, after application of the photoresist film, an edge bevel rinse (EBR) process may be performed to wash away a peripheral edge portion of the coated photoresist.

In Step 11, a post apply bake (PAB) is performed. The PAB procedure is important in determining the development rate and uniformity of development of the photoresist material. The substrate may be heated on a hotplate during the PAB procedure and heated to a temperature ranging between 105° C. and 130° C. for example. In Step 12, after the PAB, a wafer edge exposure (WEE) is carried out to expose a peripheral ring-shaped area of the substrate use radiation such as UV, DUV or EUV.

In Step 13, a flood exposure is then carried out without using a photomask. During the flood exposure, the entire surface of the photoresist film on the substrate is subjected to blanket exposure across the surface of the substrate to a first radiation such as ultraviolet (UV) light, deep ultraviolet (DUV) light, extreme ultraviolet (EUV) light or e-beam with a predetermined first irradiation dosage that is lower than the specific threshold energy for image formation of the photoresist film irradiated. The flood exposure is preferably a low dosage blanket exposure, for example, at a dosage of about 1.0-2.5 mj at a wavelength of 248 nm. It is noteworthy that the flood exposure may be carried out inside or outside the stepper and scanner exposure tool as long as no photomask is used and no circuit pattern image is created in the photoresist film. Preferably, the flood exposure may be carried out outside the stepper and scanner exposure tool and may be integrated with the WEE step for increasing the wafer throughput.

In Step 14, a main exposure using a photomask is carried out in a step and scan manner. The photoresist film on the substrate is exposed through the photomask using second radiation such as UV, DUV, EUV or e-beam with a predetermined second irradiation dosage to thereby produce latent circuit pattern image in the photoresist film. It is to be understood that the summation of the first irradiation dosage and the second irradiation dosage is greater than the specific threshold energy for image formation of the photoresist film irradiated to form the latent circuit pattern image. According to the preferred embodiment, the dosage of the main exposure is higher than the dosage of the flood exposure, but is much lower than that of the prior art method. For example, the main exposure may be carried out at a relatively higher dosage of about 10-35 mj at a wavelength of 248 nm. However, it is to be understood that the first radiation used in the flood exposure may be different from the second radiation used in the main exposure. For example, the flood exposure uses KrF laser and the main exposure uses ArF laser, or the flood exposure uses ArF laser and the main exposure uses EUV laser. Also, it is to be understood that the flood exposure may be carried out not only once, e.g. it may be carried out twice or multiple times before or after, or both before and after, the main exposure, if necessary.

It is advantageous to use the present invention because the dosage of the main exposure is reduced compared to the prior art and the lifetime of the radiation source in a lithographic system is therefore prolonged without affecting the CD uniformity and pattern profile. The present invention is also suited for the next-generation EUV lithography to solve the throughput bottleneck that stems from inadequate power source.

In Step 15, after the main exposure using the photomask, the exposed photoresist film on the substrate is then subjected to post exposure bake (PEB). Finally, in Step 16, after the PEB, the photoresist film is developed using conventional development methods known in the art. For example, the substrate with the photoresist film may be immersed in a batch of developer. Alternatively, the photoresist film may be developed by spraying the developer onto the photoresist film.

Figure 2:
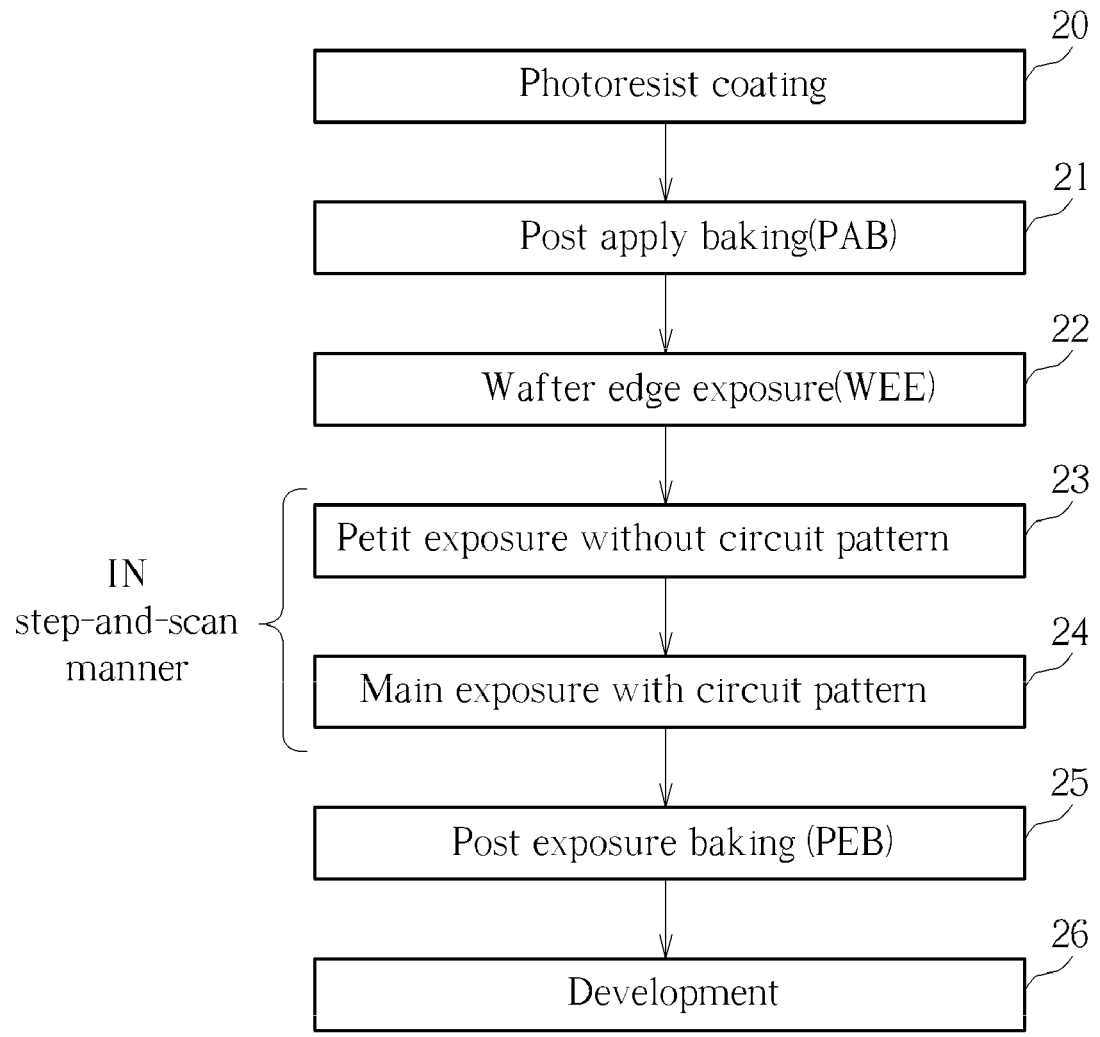
FIG. 2 is a schematic flowchart demonstrating a double-exposure method used in the semiconductor manufacturing process in accordance with another preferred embodiment of this invention.

FIG. 2 is a schematic flowchart demonstrating a double-exposure method used in the semiconductor manufacturing process in accordance with another preferred embodiment of this invention. As shown in FIG. 2, likewise, in Step 20, a photosensitive material such as a photoresist film is coated onto a main surface of a semiconductor substrate (not shown). The photoresist film may be a positive type photoresist or a negative type photoresist and may be coated on the substrate by conventional spin-on coating techniques. According to the preferred embodiment, the photoresist film has a specific threshold energy for image formation. Optionally, after application of the photoresist film, an edge bevel rinse (EBR) process may be performed to wash away a peripheral edge portion of the coated photoresist.

In Step 21, a post apply bake (PAB) is performed. The PAB procedure is important in determining the development rate and uniformity of development of the photoresist material. The substrate may be heated on a hotplate during the PAB procedure and heated to a temperature ranging between 105° C. and 130° C. for example. In Step 22, after the PAB, a wafer edge exposure (WEE) is carried out to expose a peripheral ring-shaped area of the substrate use radiation such as UV, DUV or EUV.

In Step 23, a petit exposure is then carried out without using a photomask. According to the embodiment, the petit exposure is carried out inside the stepper and scanner exposure tool and is carried out shot-by-shot in a step and scan manner. That is, each die area on the substrate is exposed successively in a predetermined direction. During the each shot of the petit exposure, the entire surface of the photoresist film within the die area on the substrate is subjected to blanket exposure to a first radiation such as UV, DUV, EUV or e-beam with a predetermined first irradiation dosage that is lower than the specific threshold energy for image formation of the photoresist film irradiated. The petit exposure is preferably a low dosage blanket exposure, for example, at a dosage of about 1.0-2.5 mj at a wavelength of 248 nm. It is noteworthy that no photomask is used and no circuit pattern image is created in the photoresist film during the petit exposure.

In Step 24, a main exposure using a photomask is then carried out in a step and scan manner analogous to the petit exposure in Step 23. The photoresist film on the substrate is exposed through the photomask using second radiation such as UV, DUV, EUV or e-beam with a predetermined second irradiation dosage to thereby produce latent circuit pattern image in the photoresist film. It is to be understood that the summation of the first irradiation dosage and the second irradiation dosage is greater than the specific threshold energy for image formation of the photoresist film irradiated to form the latent circuit pattern image. According to the preferred embodiment, the dosage of the main exposure is higher than the dosage of the petit exposure, but is much lower than that of the prior art method. For example, the main exposure may be carried out at a relatively higher dosage of about 10-35 mj at a wavelength of 248 nm. According to the embodiment, the first radiation used in the petit exposure and the second radiation used in the main exposure are the same.

It is advantageous to use the present invention because the dosage of the main exposure is reduced compared to the prior art and the lifetime of the light source in a lithographic system is therefore prolonged without affecting the CD uniformity and pattern profile. The present invention is also suited for the next-generation EUV lithography to solve the throughput bottleneck that stems from inadequate power source.

In Step 25, after the main exposure using the photomask, the exposed photoresist film on the substrate is then subjected to post exposure bake (PEB). Finally, in Step 26, after the PEB, the photoresist film is developed using conventional development methods known in the art. For example, the substrate with the photoresist film may be immersed in a batch of developer. Alternatively, the photoresist film may be developed by spraying the developer onto the photoresist film.

Those skilled in the art will readily observe that numerous modifications and alterations of the device and method may be made while retaining the teachings of the invention.

What is claimed is:

1. A semiconductor lithography process, comprising:
   providing a substrate;
   coating the substrate with a photoresist film;
   subjecting the photoresist film to a flood exposure to blanket expose the photoresist film across the substrate to a first radiation with a relatively lower dosage, wherein the flood exposure is integrated with a wafer edge exposure (WEE) step;
   subjecting the photoresist film to a main exposure using a photomask to expose the photoresist film in a step and scan manner to a second radiation with a relatively higher dosage; and
   developing the photoresist film.

2. The semiconductor lithography process of claim 1, wherein the flood exposure does not use the photomask.

3. The semiconductor lithography process of claim 1, wherein the first and second radiation comprise ultraviolet (UV) light, deep ultraviolet (DUV) light, extreme ultraviolet (EUV) light or e-beam.

4. The semiconductor lithography process of claim 1, wherein the dosage of the first and second radiation are lower than a specific threshold energy for image formation of the photoresist film.

5. The semiconductor lithography process of claim 1, wherein the flood exposure is carried out inside a stepper and scanner exposure tool.

6. The semiconductor lithography process of claim 1, wherein the flood exposure is carried out outside a stepper and scanner exposure tool.

7. The semiconductor lithography process of claim 1, wherein the flood exposure is carried out before the main exposure.

8. The semiconductor lithography process of claim 4, wherein summation of the first radiation dosage and the second radiation dosage is greater than the specific threshold energy for image formation of the photoresist film to form a latent circuit pattern image.

9. The semiconductor lithography process of claim 3, wherein the first radiation used in the flood exposure is different from the second radiation used in the main exposure.

10. A semiconductor lithography process, comprising:
    providing a substrate;
    coating the substrate with a photoresist film;
    subjecting the photoresist film to a petit exposure to expose the photoresist film in a step and scan manner to a first radiation with a relatively lower dosage;
    subjecting the photoresist film to a main exposure using a photomask to expose the photoresist film in the step and scan manner to a second radiation with a relatively higher dosage, wherein the first radiation used in the petit exposure and the second radiation used in the main exposure are the same; and
    developing the photoresist film.

11. The semiconductor lithography process of claim 10, wherein the petit exposure does not use the photomask.

12. The semiconductor lithography process of claim 10, wherein the first and second radiation comprise ultraviolet (UV) light, deep ultraviolet (DUV) light, extreme ultraviolet (EUV) light or e-beam.

13. The semiconductor lithography process of claim 10, wherein the dosage of the first and second radiation are lower than a specific threshold energy for image formation of the photoresist film.

14. The semiconductor lithography process of claim 10, wherein the flood exposure is carried out inside a stepper and scanner exposure tool.

15. The semiconductor lithography process of claim 10, wherein the petit exposure is carried out after a wafer edge exposure (WEE) and before the main exposure.

16. The semiconductor lithography process of claim 13, wherein summation of the first radiation dosage and the second radiation dosage is greater than the specific threshold energy for image formation of the photoresist film to form a latent circuit pattern image.

\* \* \* \* \*